US008872275B2

(12) United States Patent
Sasaki et al.

(10) Patent No.: US 8,872,275 B2
(45) Date of Patent: Oct. 28, 2014

(54) SRAM DEVICE HAVING FOUR TUNNELING TRANSISTORS CONNECTED TO A FLIP-FLOP

(75) Inventors: Hiroki Sasaki, Yokohama (JP); Keisuke Nakatsuka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 225 days.

(21) Appl. No.: 13/368,632

(22) Filed: Feb. 8, 2012

(65) Prior Publication Data

US 2012/0326239 A1 Dec. 27, 2012

(30) Foreign Application Priority Data

Jun. 23, 2011 (JP) .................... 2011-139603

(51) Int. Cl.
*H01L 21/70* (2006.01)
*G11C 11/412* (2006.01)
*H01L 27/11* (2006.01)

(52) U.S. Cl.
CPC .......... *G11C 11/412* (2013.01); *H01L 27/1108* (2013.01)
USPC ............................................. 257/390

(58) Field of Classification Search
CPC ........................................ H01L 27/11
USPC ............................................ 257/390
See application file for complete search history.

(56) References Cited

U.S. PATENT DOCUMENTS

| 6,510,076 B1 * | 1/2003 | Lapadat et al. | 365/154 |
| 2009/0101975 A1 * | 4/2009 | Holz et al. | 257/347 |
| 2010/0103719 A1 * | 4/2010 | Lee | 365/154 |
| 2013/0182494 A1 * | 7/2013 | Badrudduza | 365/156 |

FOREIGN PATENT DOCUMENTS

| JP | 04-206661 A | 7/1992 |
| JP | 07-263708 A | 10/1995 |
| JP | 2006-147861 A | 6/2006 |
| JP | 2009-020959 A | 1/2009 |

OTHER PUBLICATIONS

Je Min Park, et al., "Low Power Tunnel FET SRAM Cell Design and Analysis", URL: http://www.eecs.berkeley.edu/~jemins/3.pdf, Jun. 23, 2011, pp. 1-6.

J. Singh, et al.,"A Novel Si-Tunnel FET based SRAM Design for Ultra Low-Power 0.3V $V_{DD}$ Applications", IEEE, 3A-3, 2010, pp. 181-186.

Leland Chang, et al., "Stable SRAM Cell Design for the 32nm Node and Beyond", Symposium on VLSI Technology Digest of Technical Papers, 8A-2, 2005, pp. 128-129.

Office Action issued May 30, 2014 in Japanese Patent Application No. 2011-139603 (with English Translation).

* cited by examiner

*Primary Examiner* — Kevin Parendo
(74) *Attorney, Agent, or Firm* — Oblon, Spivak, McClelland, Maier & Neustadt, L.L.P.

(57) ABSTRACT

An SRAM device has a first tunnel transistor that allows a current to flow in a direction from the non-inverting output terminal to the first bit line when the first tunnel transistor turns on. The SRAM device has a second tunnel transistor allows a current to flow in a direction from the first bit line to the non-inverting output terminal when the second tunnel transistor turns on. The SRAM device has a third tunnel transistor allows a current to flow in a direction from the inverting output terminal to the second bit line when the third tunnel transistor turns on. The SRAM device has a fourth tunnel transistor allows a current to flow in a direction from the second bit line to the inverting output terminal when the fourth tunnel transistor turns on.

19 Claims, 9 Drawing Sheets

US 8,872,275 B2

SRAM DEVICE HAVING FOUR TUNNELING TRANSISTORS CONNECTED TO A FLIP-FLOP

CROSS-REFERENCE TO RELATED APPLICATION

This application is based upon and claims the benefit of priority from the prior Japanese Patent Application No. 2011-139603, filed on Jun. 23, 2011, the entire contents of which are incorporated herein by reference.

BACKGROUND

1. Field

Embodiments described herein relate generally to a Static Random Access Memory (SRAM) device.

2. Background Art

As a MOSFET is downsized according to the scaling rule, the MOSFET becomes capable of operating at lower voltages. However, the finer the MOSFET, the more widely the threshold voltage varies.

Threshold voltage variations destabilize the operation of an SRAM, which is a semiconductor storage device, and induce malfunctions such as unwanted writing induced by a read operation and a failure in a write operation.

The threshold variations of the MOSFET are caused by inevitable phenomena during manufacture such as random dopant fluctuation (RDF) and therefore are difficult to prevent.

DETAILED DESCRIPTION

An SRAM device according to an embodiment has a flip-flop circuit having a non-inverting output terminal and an inverting output terminal. The SRAM device has a first tunnel transistor that is connected between the non-inverting output terminal and a first bit line and allows a current to flow in a direction from the non-inverting output terminal to the first bit line when the first tunnel transistor turns on. The SRAM device has a second tunnel transistor that is connected in parallel with the first tunnel transistor between the non-inverting output terminal and the first bit line and allows a current to flow in a direction from the first bit line to the non-inverting output terminal when the second tunnel transistor turns on. The SRAM device has a third tunnel transistor that is connected between the inverting output terminal and a second bit line and allows a current to flow in a direction from the inverting output terminal to the second bit line when the third tunnel transistor turns on. The SRAM device has a fourth tunnel transistor that is connected in parallel with the third tunnel transistor between the inverting output terminal and the second bit line and allows a current to flow in a direction from the second bit line to the inverting output terminal when the fourth tunnel transistor turns on.

The first tunnel transistor has a higher drive power than the second tunnel transistor.

The third tunnel transistor has a higher drive power than the fourth tunnel transistor.

A tunnel transistor is one of recently developed MOSFETs based on a new physical phenomenon to implement low-voltage operation.

A conventional MOSFET turns on by forming an electrically conductive band referred to as a channel through band modulation caused by the field effect. On the other hand, the tunnel transistor turns on by enabling tunneling of electrons through band modulation caused by the field effect.

The principle of operation of the tunnel transistor enables low-voltage operation of the tunnel transistor despite the variations of the threshold voltage.

Thus, in the following embodiments, SRAMs will be described which are formed by tunnel transistors and thus can stably operate with low power consumption.

Figure 1:
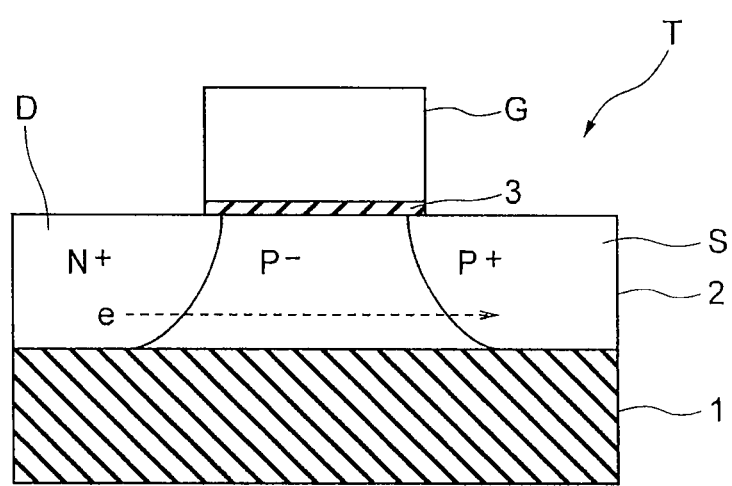
FIG. 1 is a cross-sectional view showing an example of a schematic configuration of a tunnel transistor.

FIG. 1 is a cross-sectional view showing an example of a schematic configuration of a tunnel transistor. Although the tunnel transistor shown in FIG. 1 is an nMOS transistor, the same description applies to a case where the tunnel transistor is a pMOS transistor, except for the conductivity type.

As shown in FIG. 1, a tunnel transistor "T" has a source region "S", which is a P+ impurity diffusion region, and an N+ drain region "D", which is an N+ impurity diffusion region, that are formed in a semiconductor layer 2 containing P− type impurities formed on a buried oxide 1, and a gate electrode "G" that is formed on the semiconductor layer 2 with a gate insulating film 3 interposed therebetween, for example.

Unlike the conventional MOSFETs, the tunnel transistor "T" has an asymmetric structure and therefore is characterized in that the current flows in one direction.

In FIG. 1, the arrow indicates the direction in which electrons "e" flow when the tunnel transistor turns on (in other words, a current flows in the direction opposite to the direction indicated by the arrow).

The current flowing across the PN junction in the semiconductor layer 2 of the tunnel transistor "T" is controlled by the gate voltage. Therefore, if the potential of the source region "S" (P+) is sufficiently higher than the potential of the drain region "D" (N+), the current is hard to control by the gate voltage.

In view of this, in the embodiments described below, the SRAMs are supposed to operate within a voltage range that does not exceed the forward bias voltage applied to the PN junction formed in the tunnel transistor.

In the following, embodiments will be described with reference to the drawings.

Embodiment 1

Figure 2:
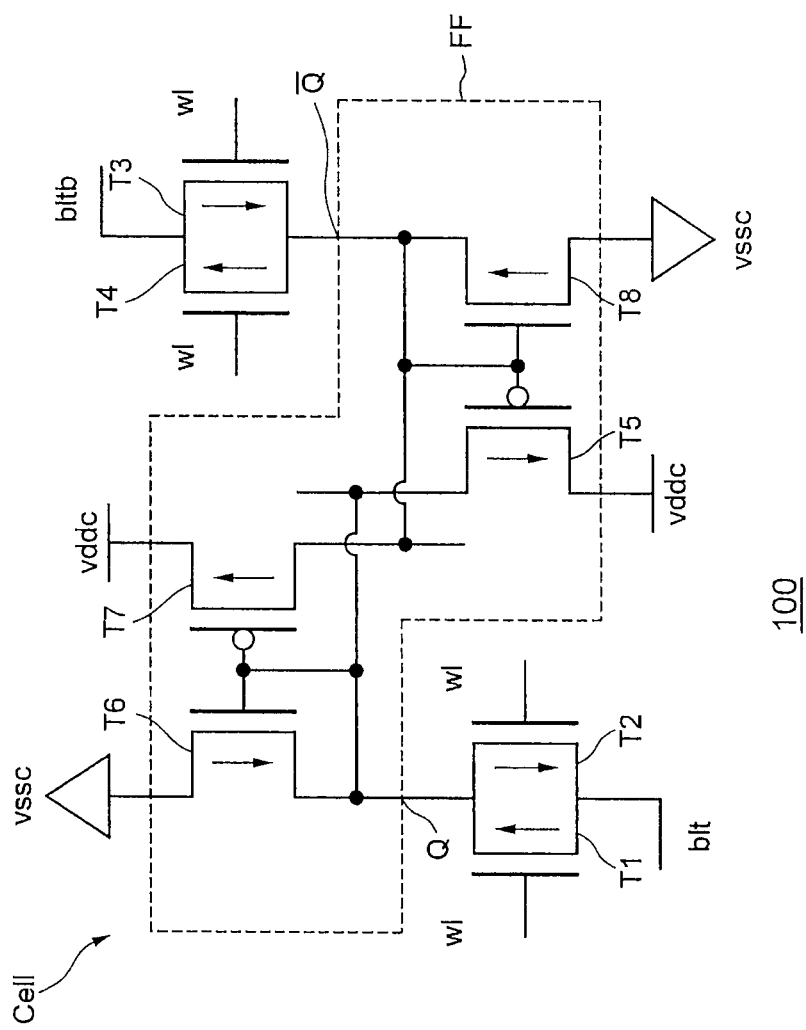
FIG. 2 is a circuit diagram showing an example of a configuration of an SRAM cell of an SRAM device according to an embodiment 1.
Figure 3:
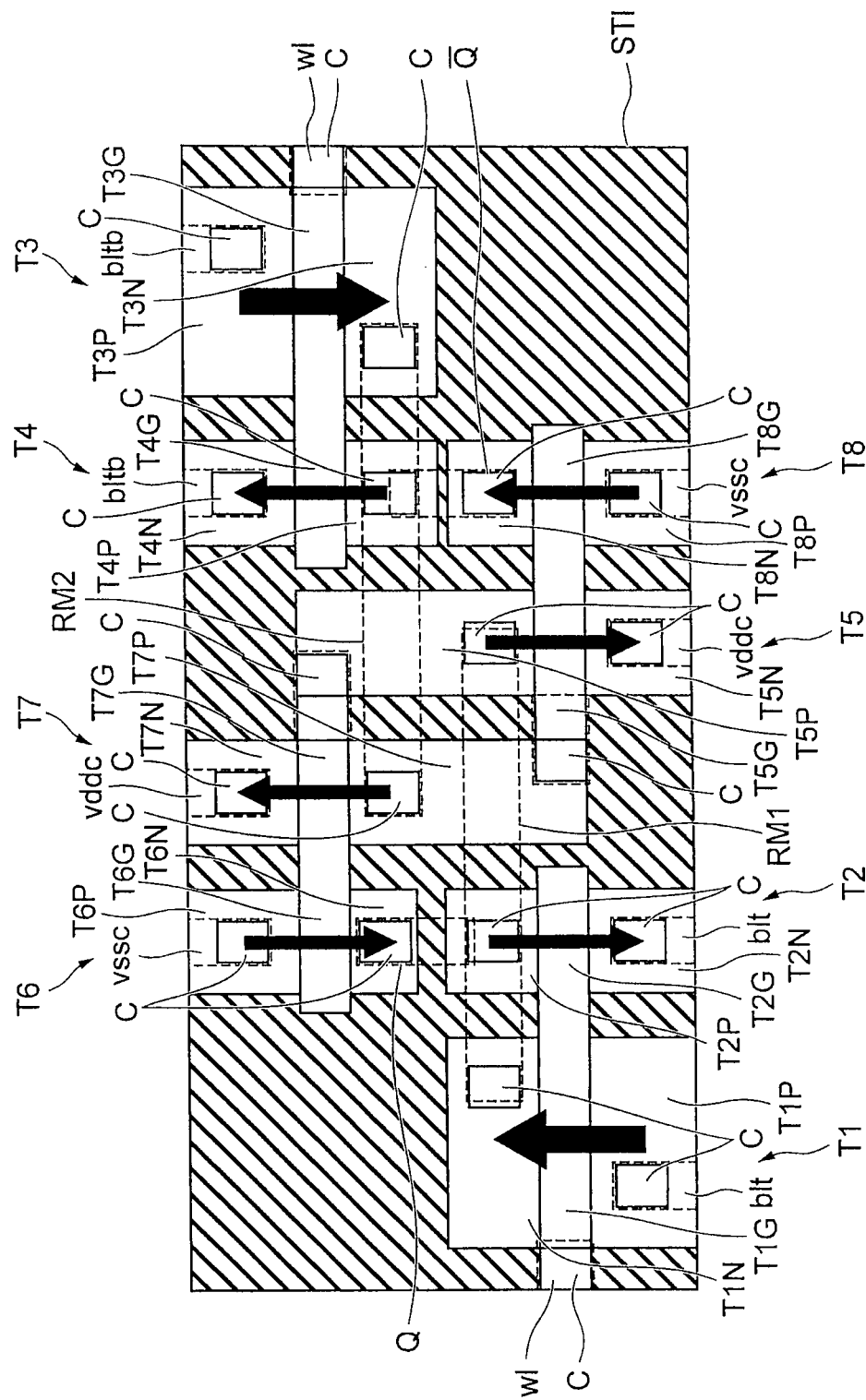
FIG. 3 is a diagram showing an example of a layout of the SRAM cell according to the embodiment 1.

FIG. 2 is a circuit diagram showing an example of a configuration of an SRAM cell of an SRAM device according to an embodiment 1. FIG. 3 is a diagram showing an example of a layout of the SRAM cell according to the embodiment 1.

In FIGS. 2 and 3, the arrows indicate the directions in which electrons "e" flow when the tunnel transistor turns on (in other words, a current flows in the directions opposite to the directions indicated by the arrows).

As shown in FIGS. 2 and 3, an SRAM device 100 includes a first bit line "blt", a second bit line "bltb", a word line "wl", a flip-flop circuit "FF", a first tunnel transistor "T1" and a second tunnel transistor "T2" forming a first pass gate, and a third tunnel transistor "T3" and a fourth tunnel transistor "T4" forming a second pass gate. The flip-flop circuit "FF", the first tunnel transistor "T1" and the second tunnel transistor "T2" forming the first pass gate, and the third tunnel transistor "T3" and the fourth tunnel transistor "T4" forming the second pass gate form an SRAM cell "Cell".

The flip-flop circuit "FF" has a non-inverting output terminal "Q" and an inverting output terminal "/Q".

The first tunnel transistor "T1" is connected between the non-inverting output terminal "Q" and the first bit line "blt", and a gate "T1G" is connected to the word line "wl". An N type impurity region "T1N" of the first tunnel transistor "T1" is electrically connected to the non-inverting output terminal "Q" via a contact plug "C" and a local metal wire "RM1" (FIG. 3). A P type impurity region "T1P" of the first tunnel transistor "T1" is electrically connected to the first bit line "blt" via a contact plug "C" (FIG. 3).

According to the signal (voltage) applied to the word line "wl", the first tunnel transistor "T1" turns on to allow a current to flow in the direction from the non-inverting output terminal "Q" to the first bit line "blt".

The second tunnel transistor "T2" is connected in parallel with the first tunnel transistor "T1" between the non-inverting output terminal "Q" and the first bit line "blt", and a gate "T2G" is connected to the word line "wl". An N type impurity region "T2N" of the second tunnel transistor "T2" is electrically connected to the first bit line "blt" via a contact plug "C" (FIG. 3). A P type impurity region "T2P" of the second tunnel transistor "T2" is electrically connected to the non-inverting output terminal "Q" via a contact plug "C" and the local metal wire "RM1" (FIG. 3).

According to the signal (voltage) applied to the word line "wl", the second tunnel transistor "T2" turns on to allow a current to flow in the direction from the first bit line "blt" to the non-inverting output terminal "Q".

The first tunnel transistor "T1" is configured to have a higher drive power (in other words, to allow a larger current when it turns on) than the second tunnel transistor "T2".

For example, the first tunnel transistor "T1" is configured to have a larger area than the second tunnel transistor "T2" (FIG. 3). In particular, the first tunnel transistor "T1" has a larger gate width than the second tunnel transistor "T2".

As a result, the drive power of the first pass gate during write operation is set to be higher than the drive power of the first pass gate during read operation. In other words, the current flowing through the first pass gate during write operation is larger than the current flowing through the first pass gate during read operation.

The third tunnel transistor "T3" is connected between the inverting output terminal "/Q" and the second bit line "bltb", and a gate "T3G" is connected to the word line "wl". An N type impurity region "T3N" of the third tunnel transistor "T3" is electrically connected to the inverting output terminal "/Q" via a contact plug "C" and a local metal wire "RM2" (FIG. 3). A P type impurity region "T3P" of the third tunnel transistor "T3" is electrically connected to the second bit line "bltb" via a contact plug "C" (FIG. 3).

According to the signal (voltage) applied to the word line "wl", the third tunnel transistor "T3" turns on to allow a current to flow in the direction from the inverting output terminal "/Q" to the second bit line "bltb".

The fourth tunnel transistor "T4" is connected in parallel with the third tunnel transistor T3 between the inverting output terminal "/Q" and the second bit line "bltb", and a gate "T4G" is connected to the word line "wl". An N type impurity region "T4N" of the fourth tunnel transistor "T4" is electrically connected to the second bit line "bltb" via a contact plug "C" (FIG. 3). A P type impurity region "T4P" of the fourth tunnel transistor "T4" is electrically connected to the inverting output terminal "/Q" via a contact plug C and the local metal wire "RM2" (FIG. 3).

According to the signal (voltage) applied to the word line "wl", the fourth tunnel transistor "T4" turns on to allow a current to flow in the direction from the second bit line "bltb" to the inverting output terminal "/Q".

The third tunnel transistor "T3" is configured to have a higher drive power than the fourth tunnel transistor "T4".

For example, the third tunnel transistor "T3" is configured to have a larger area than the fourth tunnel transistor "T4" (FIG. 3). In particular, the third tunnel transistor "T3" has a larger gate width than the fourth tunnel transistor "T4".

As a result, the drive power of the second pass gate during write operation is set to be higher than the drive power of the second pass gate during read operation. In other words, the current flowing through the second pass gate during write operation is larger than the current flowing through the second pass gate during read operation.

Although the first to fourth tunnel transistors "T1" to "T4" according to this embodiment are nMOS transistors of the same conductivity type, pMOS transistors can be used instead of the nMOS transistors by adapting the polarities of the circuit to perform the same operation.

As described above, the first to fourth tunnel transistors "T1" to "T4" are connected to one common word line "wl" at the gates thereof.

Therefore, the operations of the first to fourth tunnel transistors "T1" to "T4" are controlled by the signal (voltage) applied to the word line "wl".

In particular, the first to fourth tunnel transistors "T1" to "t4" are controlled not to exceed the forward bias at the PN junction, as described above.

As shown in FIG. 2, the flip-flop circuit "FF" includes a fifth tunnel transistor "T5", a sixth tunnel transistor "T6", a seventh tunnel transistor "T7", and an eighth tunnel transistor "T8".

The fifth tunnel transistor "T5" has an N type impurity region "T5N", a P type impurity region "T5P", and a gate "T5G" (FIG. 3). The fifth tunnel transistor "T5" is connected between a power supply "vddc" and the non-inverting output terminal "Q", and the gate "T5G" is connected to the inverting output terminal "/Q". According to the signal (voltage) applied to the inverting output terminal "/Q", the fifth tunnel transistor "T5" turns on to allow a current to flow only in the direction from the power supply "vddc" to the non-inverting output terminal "Q".

The sixth tunnel transistor "T6" has an N type impurity region "T6N", a P type impurity region "T6P", and a gate "T6G" (FIG. 3). The sixth tunnel transistor "T6" is connected between the non-inverting output terminal "Q" and ground "vssc", and the gate "T6G" is connected to the non-inverting output terminal "Q". According to the signal (voltage) applied to the non-inverting output terminal "Q", the sixth tunnel transistor "T6" turns on to allow a current to flow only in the direction from the non-inverting output terminal "Q" to the ground "vssc".

The seventh tunnel transistor "T7" has an N type impurity region "T7N", a P type impurity region "T7P", and a gate "T7G" (FIG. 3). The seventh tunnel transistor "T7" is connected between the power supply "vddc" and the inverting output terminal "/Q", and the gate "T7G" is connected to the non-inverting output terminal "Q". According to the signal (voltage) applied to the non-inverting output terminal "Q", the seventh tunnel transistor "T7" turns on to allow a current to flow only in the direction from the power supply "vddc" to the non-inverting output terminal "Q".

The eighth tunnel transistor "T8" has an N type impurity region "T8N", a P type impurity region "T8P", and a gate "T8G" (FIG. 3). The eighth tunnel transistor "T8" is connected between the inverting output terminal "/Q" and the ground "vssc", and the gate "T8G" is connected to the inverting output terminal "/Q". According to the signal (voltage) applied to the inverting output terminal "/Q", the eighth tunnel transistor "TB" turns on to allow a current to flow only in the direction from the inverting output terminal "/Q" to the ground "vssc".

The first to eighth tunnel transistors "T1" to "T8" are isolated (insulated) from each other by a device isolation insulating film "STI".

According to this embodiment, the flip-flop circuit "FF" is formed by four tunnel transistors, for example. Alternatively, however, the flip-flop circuit "FF" may be formed by conventional MOSFETs.

According to this embodiment, as shown in FIG. 2, the fifth and seventh tunnel transistors "T5" and "T7" are pMOS transistors, and the sixth and eighth tunnel transistors "T6" and "T8" are nMOS transistors. However, the polarities of the tunnel transistors can be changed as required by adapting the polarities of the circuit to perform the same operation.

The first and third tunnel transistors "T1" and "T3" are configured to have higher drive powers than the fifth to eighth tunnel transistors "T5" to "T8".

As described above, the tunnel transistor has an asymmetric structure unlike the conventional MOSFETs and therefore is characterized in that the current flows only in one direction.

Therefore, simply replacing the conventional MOSFETs with the tunnel transistors is not sufficient: a single tunnel transistor cannot perform both the read operation to read a negative potential from the SRAM cell to the bit line and the write operation to write a negative potential to the SRAM cell from the bit line.

However, according to this embodiment, as described above, since the first and second pass gates are formed by the first to fourth tunnel transistors "T1" to "T4", the pass gates are configured to have a lower drive power in the read operation and a higher drive power in the write operation.

Figure 4:
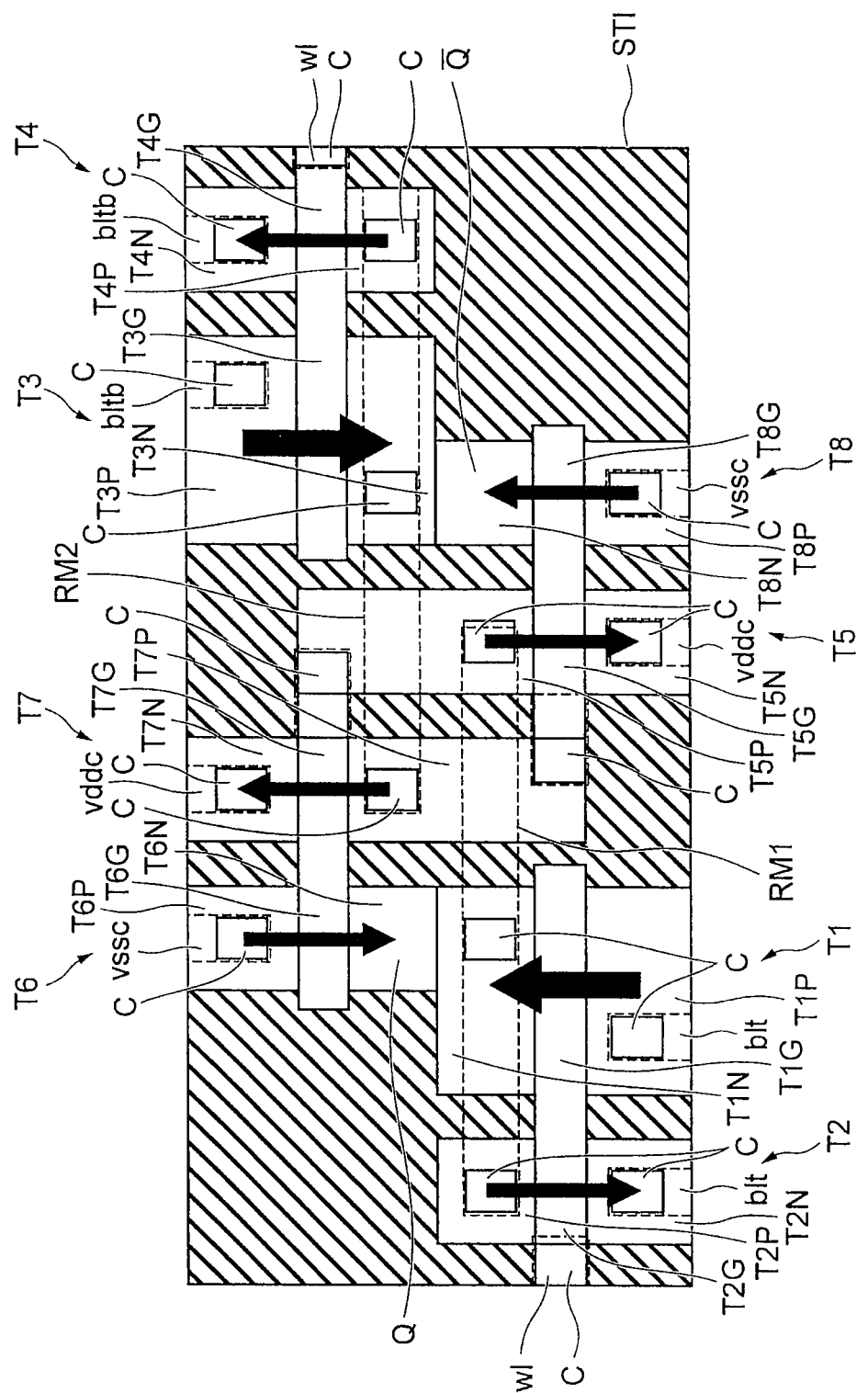
FIG. 4 is a diagram showing another example of the layout of the SRAM cell according to the embodiment 1.

FIG. 4 is a diagram showing another example of the layout of the SRAM cell according to the embodiment 1.

As shown in FIG. 4, the layouts of the first and second tunnel transistors "T1" and "T2" are interchangeable. The layouts of the third and fourth tunnel transistors "T3" and "T4" are also interchangeable.

Even if the layouts of the tunnel transistors forming one pass gate are interchanged, the resulting circuit is equivalent to the original circuit and therefore can operate in the same manner.

Next, an example of the operation of the SRAM device configured as described above according to this embodiment will be described.

First, an operation to read data from the SRAM cell (read operation) will be described.

In the read operation, in the SRAM device 100 shown in FIG. 2, a "Low" level signal is first applied to the word line "wl" to turn off the first to fourth tunnel transistors "T1" to "T4", and a "High" level signal is applied to the first bit line "blt" and the second bit line "bltb".

Then, the first bit line "blt" and the second bit line "bltb" are electrically separated from the power supply to bring the first bit line "blt" and the second bit line "bltb" into a floating state Then, the voltage of the word line "wl" is changed from the "Low" level to the "High" level, thereby turning on the first to fourth tunnel transistors "T1" to "T4" forming the first and second pass gates to connect the non-inverting output terminal "Q" of the flip-flop circuit "FF" to the first bit line "blt" and connect the inverting output terminal "/Q" to the second bit line "bltb".

As a result, the negative potential in the SRAM cell is read out to any one of the first bit line "blt" and the second bit line "bltb".

After that, the potential difference between the first bit line "blt" and the second bit line "bltb" is amplified with a sense amplifier or the like (not shown), and the potential of one of the bit line drops to the negative potential according to the potential of the SRAM cell.

In the read operation of the SRAM cell "Cell", if the negative potential of the SRAM cell "Cell" is rapidly read out to the bit line when the first and second pass gates turn on, a read fault may occur in which the potential of the SRAM cell is inverted (the states of the flip-flop circuit is changed).

To avoid the fault, it is preferred that the current drive power of the first pass gate in the direction from the first bit line "blt" to the non-inverting output terminal "Q" and the current drive power of the second pass gate in the direction from the second bit line "bltb" to the inverting output terminal "/Q" are not excessively high.

Next, an operation to write data to the SRAM cell (write operation) will be described.

Figure 5:
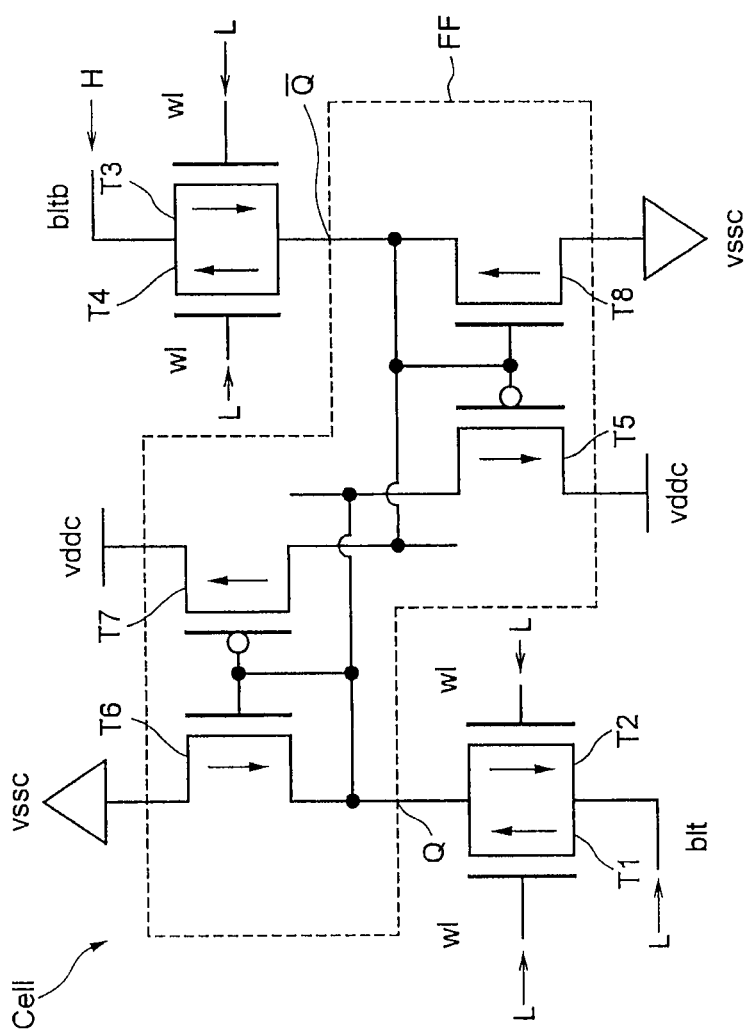
FIG. 5 is a diagram showing an example of a state in which write signals are applied to the bit lines in the write operation of the SRAM device 100 shown in FIG. 2.
Figure 6:
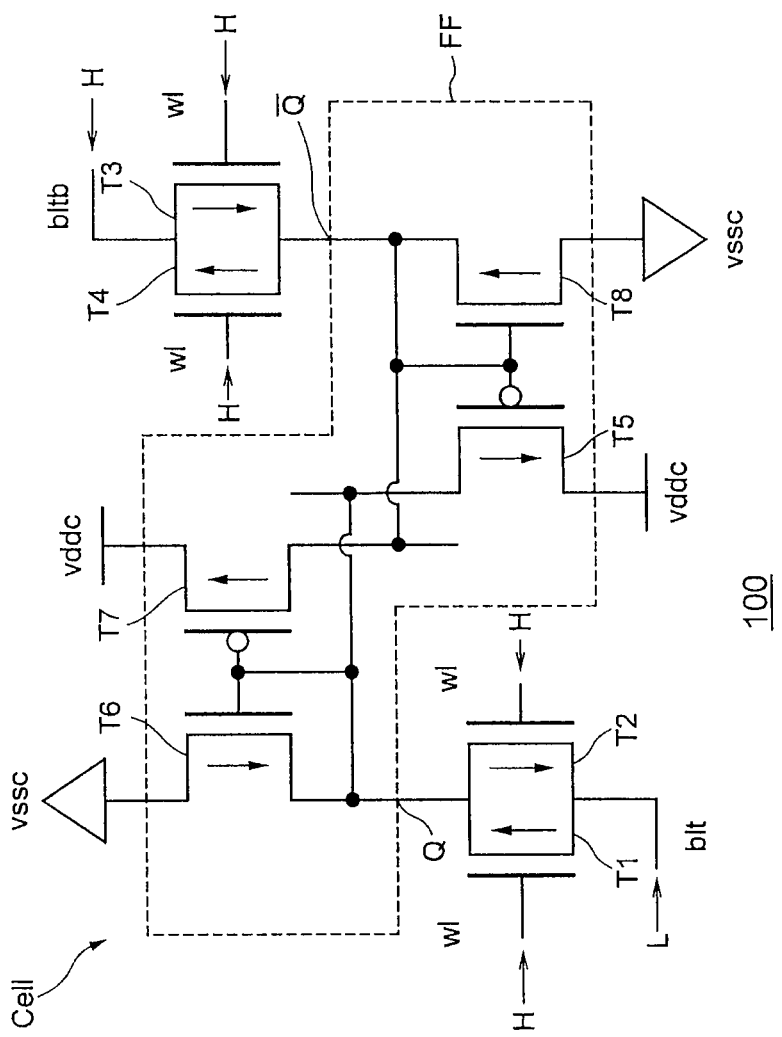
FIG. 6 is a diagram showing an example of a state in which a selection signal is applied to the word line "wl" in the write operation of the SRAM device 100 shown in FIG. 2.
Figure 7:
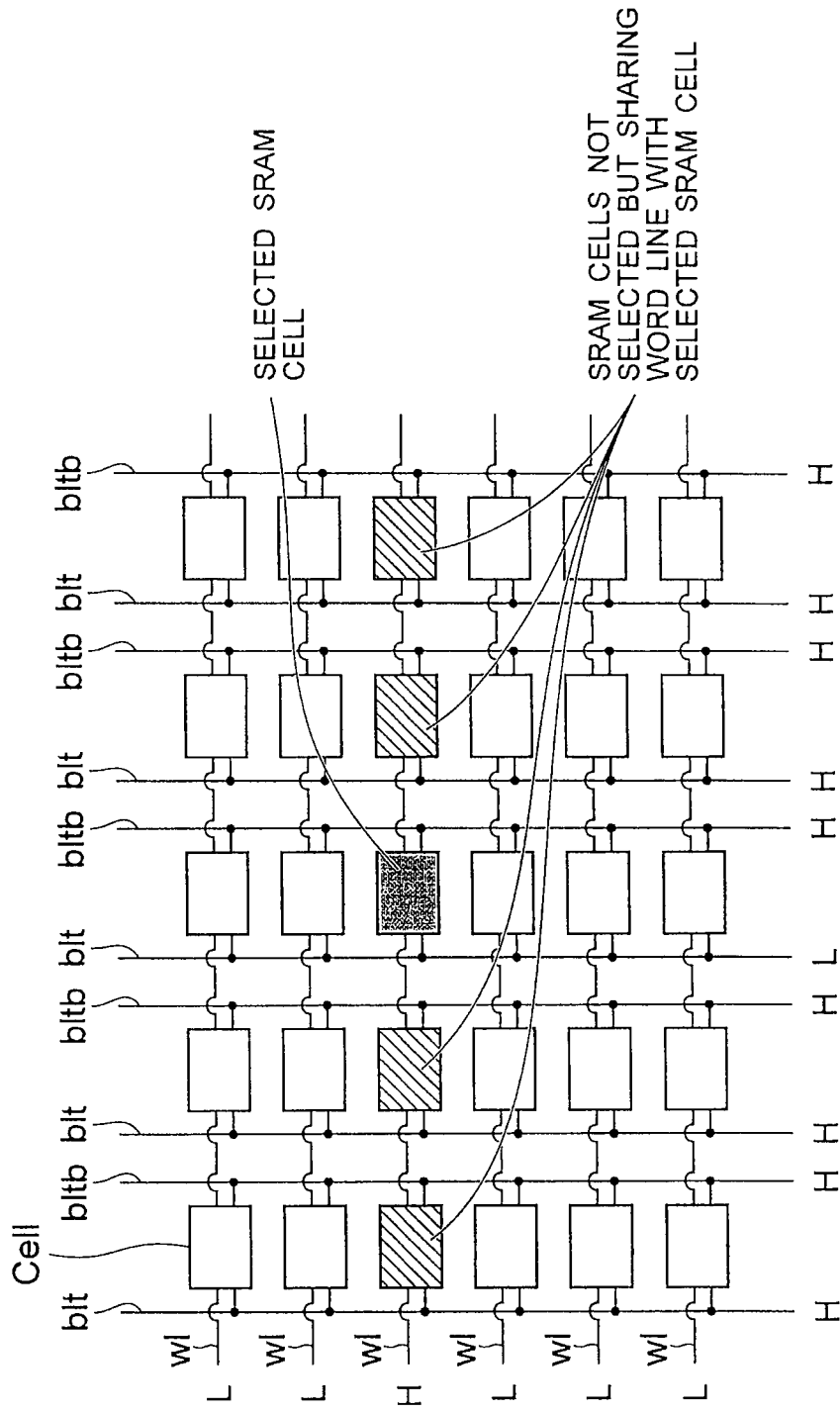
FIG. 7 is a diagram showing an example of a configuration of a memory cell array in which SRAM cells "Cell" of the SRAM device 100 are arranged in a matrix.

FIG. 5 is a diagram showing an example of a state in which write signals are applied to the bit lines in the write operation of the SRAM device 100 shown in FIG. 2. FIG. 6 is a diagram showing an example of a state in which a selection signal is applied to the word line "wl" in the write operation of the SRAM device 100 shown in FIG. 2. FIG. 7 is a diagram showing an example of a configuration of a memory cell array in which SRAM cells "Cell" of the SRAM device 100 are arranged in a matrix.

As shown in FIG. 5, in the write operation, in the SRAM device 100 shown in FIG. 2, a "Low" level signal is first applied to the word line "wl" of the SRAM cell "Cell" to turn off the first to fourth tunnel transistors "T1" to "T4", and in this state, a first write signal (at the "Low" level in this example) is applied to the first bit line "blt", and a second write signal (at the "High" level in this example), which is logically inverted from the first write signal, is applied to the second bit line "bltb".

Then, as shown in FIG. 6, the potential of the word line "wl" is changed from the "Low" level to the "High" level to turn on the first to fourth tunnel transistors "T1" to "T4". By this operation, the particular SRAM cell "Cell" is selected from among a plurality of SRAM cells "Cell".

That is, in the selected SRAM cell "Cell", the first to fourth tunnel transistors "T1" to "T4" forming the first and second pass gates are turned on to connect the non-inverting output terminal "Q" of the flip-flop circuit "FF" to the first bit line "blt" and connect the inverting output terminal "/Q" to the second bit line "bltb".

As a result, the potentials of the first and second bit lines "blt" and "bltb" are written to the selected SRAM cell "Cell" (in other words, the storage state of the flip-flop circuit changes).

In the write operation, if the drive powers of the first and second pass gates are too low, the storage state of the flip-flop circuit may not change in the operation shown in FIG. 6. That is, a write fault may occur: writing to the selected SRAM cell may fail.

As shown in FIG. 7, in the write operation of the selected SRAM cell, a pseudo read operation occurs in the SRAM cells "Cell" that are not selected but connected to the word line "wl" to which the "High" level selection signal is applied, because the potential of the word line "wl" is raised to the "High" level.

Therefore, if the drive powers of the first and second pass gates are too high, an erroneous writing may occur in the SRAM cells that are not selected in the write operation of the selected SRAM cell.

To avoid this, when the potential of the word line "wl" is raised to the "High" level, the drive power of the tunnel transistors that allow electrons to flow from the SRAM cell "Cell" to the first and second bit lines "blt" and "bltb" has to be lowered, while the drive power of the tunnel transistors that allow electrons to flow from the first and second bit lines "bit" and "bltb" to the SRAM cell has to be raised.

That is, the drive powers of the first and second pass gates need to be low in the read operation and high in the write operation.

Conventional MOSFETs can hardly satisfy the two requirements at the same time. However, as described above, the tunnel transistor is an asymmetric MOSFET and therefore can satisfy the two requirements at the same time.

Thus, as described above, according to this embodiment, since the first and second pass gates are formed by the first to fourth tunnel transistors "T1" to "T4", the pass gates can be configured to have a low drive power in the read operation and a high drive power in the write operation.

In this way, an SRAM device capable of stably operating with low power consumption can be provided.

As described above, the SRAM device according to the embodiment 1 can stably operate with low power consumption.

Embodiment 2

In the embodiment 1 described above, the first and second pass gates are formed by tunnel transistors having different areas in order to have a low drive power in the read operation and a high drive power in the write operation.

According to the embodiment, the circuit area may be large.

Thus, according to an embodiment 2 described below, the first and second pass gates are formed by tunnel transistors having different impurity densities of the source and drain regions in order to have a low drive power in the read operation and a high drive power in the write operation.

Figure 8:
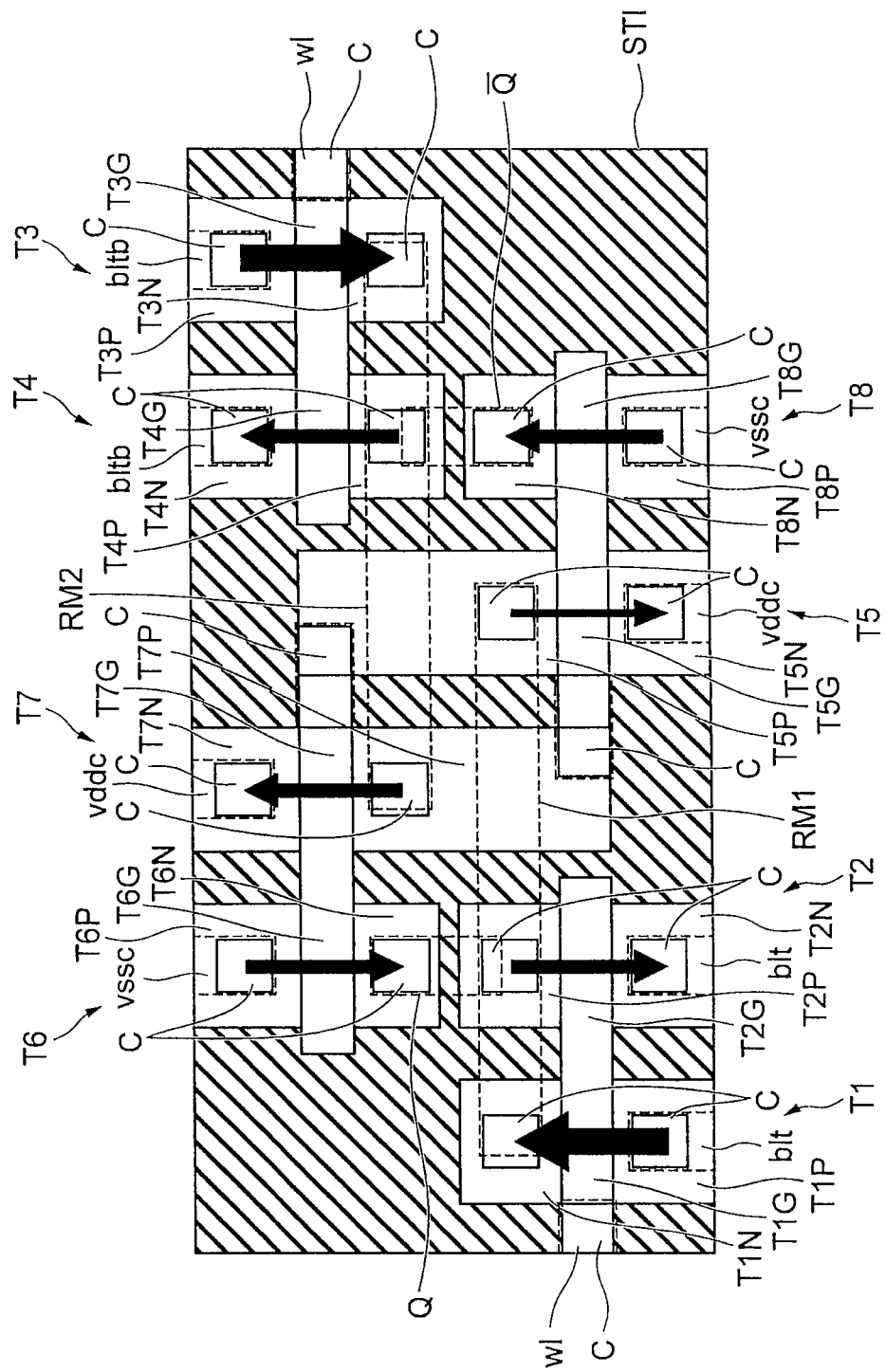
FIG. 8 is a diagram showing an example of the layout of an SRAM cell according to the embodiment 2.
Figure 9:
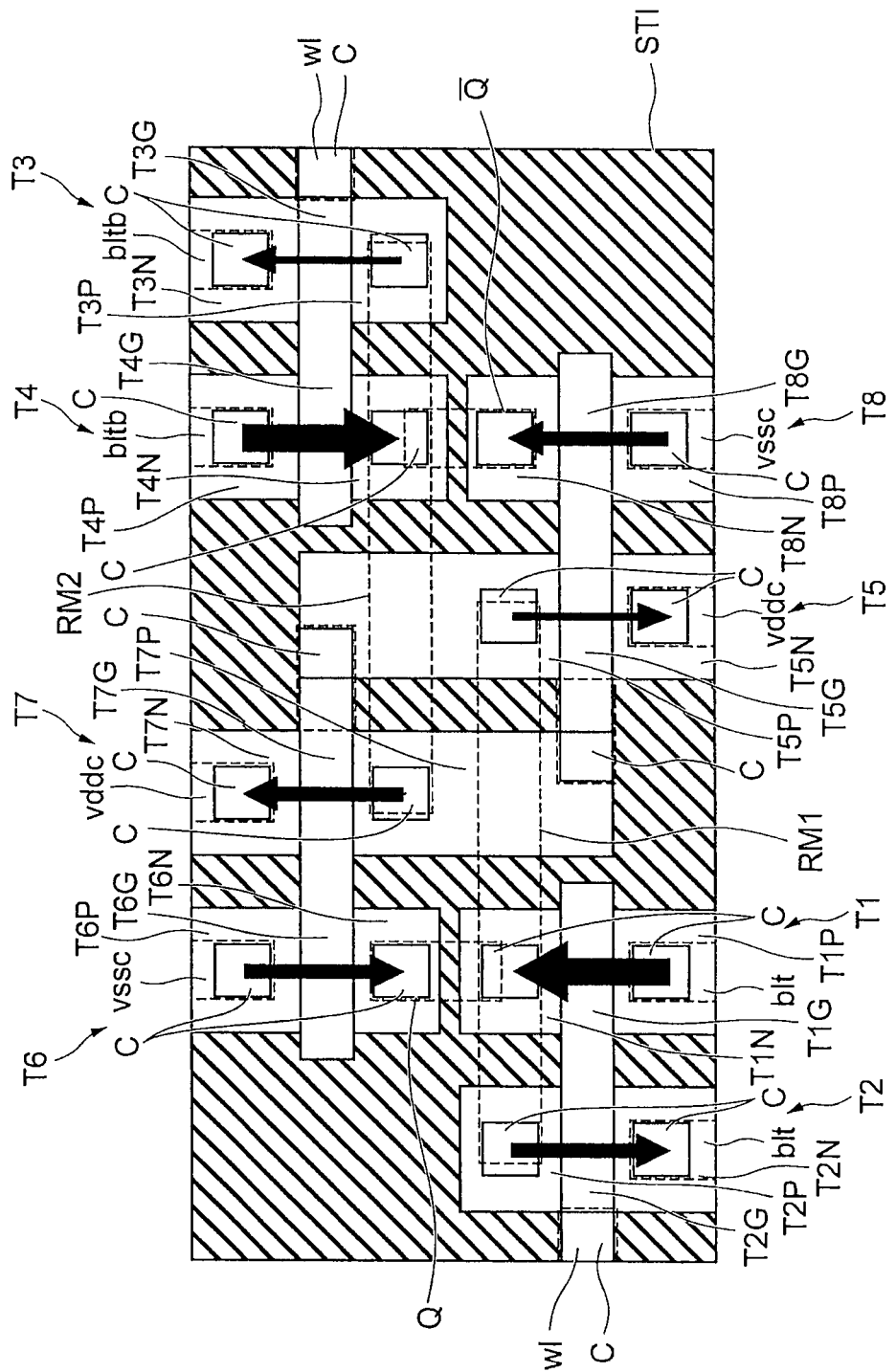
FIG. 9 is a diagram showing another example of the layout of the SRAM cell according to the embodiment 2.

FIG. 8 is a diagram showing an example of the layout of an SRAM cell according to the embodiment 2. FIG. 9 is a diagram showing another example of the layout of the SRAM cell according to the embodiment 2. In FIGS. 8 and 9, the same reference symbols denote the same components as those according to the embodiment 1.

As shown in FIG. 8, the first and second tunnel transistors "T1" and "T2" forming the first pass gate have approximately equal areas.

However, the source and drain regions (the N type impurity region "T1N" and the P type impurity region "T1P") of the first tunnel transistor "T1" have higher impurity densities than the source and drain regions (the N type impurity region "T2N" and the P type impurity region "T2P") of the second tunnel transistor "T2".

As a result, the first tunnel transistor "T1" has a higher drive power (or allows a larger current when it turns on) than the second tunnel transistor "T2", as in the embodiment 1.

Therefore, as in the embodiment 1, the drive power of the first pass gate in the write operation is higher than the drive power of the first pass gate in the read operation. That is, the current flowing through the first pass gate in the write operation is larger than the current flowing through the first pass gate in the read operation.

In addition, the source and drain regions (the N type impurity region "T3N" and the P type impurity region "T3P") of the third tunnel transistor "T3" have higher impurity densities than the source and drain regions (the N type impurity region "T4N" and the P type impurity region "T4P") of the fourth tunnel transistor "T4".

As a result, the third tunnel transistor "T3" has a higher drive power than the fourth tunnel transistor "T4", as in the embodiment 1.

Therefore, as in the embodiment 1, the drive power of the second pass gate in the write operation is higher than the drive power of the second pass gate in the read operation. That is, the current flowing through the second pass gate in the write operation is larger than the current flowing through the second pass gate in the read operation.

Furthermore, as shown in FIG. 9, the layouts of the first and second tunnel transistors "T1" and "T2" are interchangeable. The layouts of the third and fourth tunnel transistors "T3" and "T4" are also interchangeable.

Even if the layouts of the tunnel transistors forming one pass gate are interchanged, the resulting circuit is equivalent to the original circuit and therefore can operate in the same manner.

In the other respects, the SRAM cell is configured in the same way as in the embodiment 1.

An SRAM device incorporating the SRAM cells described above operates in the same way as the SRAM device according to the embodiment 1, since their circuits are equivalent.

Thus, as described above, according to this embodiment, since the first and second pass gates are formed by the first to fourth tunnel transistors "T1" to "T4", the pass gates can be configured to have a low drive power in the read operation and a high drive power in the write operation.

In this way, an SRAM device capable of stably operating with low power consumption can be provided, as in the embodiment 1.

As described above, the SRAM device according to the embodiment 2 can stably operate with low power consumption.

Note that the embodiments 1 and 2 may be combined with each other. That is, the first and second pass gates may be formed by tunnel transistors that have different areas as well as different impurity densities of the source and drain regions in order to have a low drive power in the read operation and a high drive power in the write operation.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An SRAM device, comprising:
a flip-flop circuit having a non-inverting output terminal and an inverting output terminal;
a first tunnel transistor that is connected between the non-inverting output terminal and a first bit line and allows a current to flow in a direction from the non-inverting output terminal to the first bit line when the first tunnel transistor turns on;
a second tunnel transistor that is connected in parallel with the first tunnel transistor between the non-inverting output terminal and the first bit line and allows a current to flow in a direction from the first bit line to the non-inverting output terminal when the second tunnel transistor turns on;
a third tunnel transistor that is connected between the inverting output terminal and a second bit line and allows a current to flow in a direction from the inverting output terminal to the second bit line when the third tunnel transistor turns on; and
a fourth tunnel transistor that is connected in parallel with the third tunnel transistor between the inverting output terminal and the second bit line and allows a current to flow in a direction from the second bit line to the inverting output terminal when the fourth tunnel transistor turns on,
wherein the first tunnel transistor has a higher drive power than the second tunnel transistor,
the third tunnel transistor has a higher drive power than the fourth tunnel transistor, and
one region of source and drain regions in each of the first to fourth tunnel transistors is p-type and the other region is n-type.

2. The SRAM device according to claim 1, wherein the first tunnel transistor has a larger channel width than the second tunnel transistor, and the third tunnel transistor has a larger channel width than the fourth tunnel transistor.

3. The SRAM device according to claim 2, wherein the first tunnel transistor has a larger gate width than the second tunnel transistor, and the third tunnel transistor has a larger gate width than the fourth tunnel transistor.

4. The SRAM device according to claim 1, wherein source and drain regions of the first tunnel transistor have higher impurity densities than source and drain regions of the second tunnel transistor; and
source and drain regions of the third tunnel transistor have higher impurity densities than source and drain regions of the fourth tunnel transistor.

5. The SRAM device according to claim 1, wherein a first write signal is applied to the first bit line, and a second write signal, which is logically inverted from the first write signal, is applied to the second bit line, and
after that, a potential of a word line is controlled to turn on the first to fourth tunnel transistors.

6. The SRAM device according to claim 1, wherein the first to fourth tunnel transistors are controlled not to exceed a forward bias at a PN junction, the PN junction being formed between the source and drain regions.

7. The SRAM device according to claim 1, further comprising a fifth tunnel transistor that is connected between a power supply and the non-inverting output terminal, has a gate connected to the inverting output terminal, and allows a current to flow only in the direction from the power supply to the non-inverting output terminal when the fifth tunnel transistor turns on;
a sixth tunnel transistor that is connected between the non-inverting output terminal and ground, has a gate connected to the non-inverting output terminal, and allows a current to flow only in the direction from the non-inverting output terminal to the ground when the sixth tunnel transistor turns on;
a seventh tunnel transistor that is connected between the power supply and the inverting output terminal, has a gate connected to the non-inverting output terminal, and allows a current to flow only in the direction from the power supply to the non-inverting output terminal when the seventh tunnel transistor turns on; and
an eighth tunnel transistor that is connected between the inverting output terminal and the ground, has a gate connected to the inverting output terminal, and allows a current to flow only in the direction from the inverting output terminal to the ground when the eighth tunnel transistor turns on.

8. The SRAM device according to claim 7, wherein the first and second tunnel transistors have a higher drive power than the fifth to eighth tunnel transistors.

9. The SRAM device according to claim 1, wherein the source regions of the first to fourth tunnel transistors have the same conductivity type, and
the drain regions of the first to fourth tunnel transistors have the same conductivity type.

10. The SRAM device according to claim 1, wherein the first to fourth tunnel transistors are connected to one common word line at the gates thereof.

11. An SRAM device, comprising:
a flip-flop circuit;
a first tunnel transistor that is connected between a non-inverting output terminal of the flip-flop circuit and a first bit line and allows a current to flow in a direction from the non-inverting output terminal to the first bit line when the first tunnel transistor turns on;
a second tunnel transistor that is connected in parallel with the first tunnel transistor between the non-inverting output terminal and the first bit line and allows a current to flow in a direction from the first bit line to the non-inverting output terminal when the second tunnel transistor turns on;
a third tunnel transistor that is connected between a inverting output terminal of the flip-flop circuit and a second bit line and allows a current to flow in a direction from the inverting output terminal to the second bit line when the third tunnel transistor turns on; and
a fourth tunnel transistor that is connected in parallel with the third tunnel transistor between the inverting output terminal and the second bit line and allows a current to flow in a direction from the second bit line to the inverting output terminal when the fourth tunnel transistor turns on,
wherein gates of the first to fourth tunnel transistors are connected to one common word line, and
one region of source and drain regions in each of the first to fourth tunnel transistors is p-type and the other region is n-type.

12. The SRAM device according to claim 11, wherein the first tunnel transistor has a larger channel width than the second tunnel transistor, and the third tunnel transistor has a larger channel width than the fourth tunnel transistor.

13. The SRAM device according to claim 12, wherein the first tunnel transistor has a larger gate width than the second tunnel transistor, and the third tunnel transistor has a larger gate width than the fourth tunnel transistor.

14. The SRAM device according to claim 11, wherein source and drain regions of the first tunnel transistor have higher impurity densities than source and drain regions of the second tunnel transistor; and source and drain regions of the third tunnel transistor have higher impurity densities than source and drain regions of the fourth tunnel transistor.

15. The SRAM device according to claim 11, wherein a first write signal is applied to the first bit line, and a second write signal, which is logically inverted from the first write signal, is applied to the second bit line, and after that, a potential of a word line is controlled to turn on the first to fourth tunnel transistors.

16. The SRAM device according to claim 11, wherein the first to fourth tunnel transistors are controlled not to exceed a forward bias at a PN junction, the PN junction being formed between the source and drain regions.

17. The SRAM device according to claim 11, further comprising a fifth tunnel transistor that is connected between a power supply and the non-inverting output terminal, has a gate connected to the inverting output terminal, and allows a current to flow only in the direction from the power supply to the non-inverting output terminal when the fifth tunnel transistor turns on;

a sixth tunnel transistor that is connected between the non-inverting output terminal and ground, has a gate connected to the non-inverting output terminal, and allows a current to flow only in the direction from the non-inverting output terminal to the ground when the sixth tunnel transistor turns on;

a seventh tunnel transistor that is connected between the power supply and the inverting output terminal, has a gate connected to the non-inverting output terminal, and allows a current to flow only in the direction from the power supply to the non-inverting output terminal when the seventh tunnel transistor turns on; and an eighth tunnel transistor that is connected between the inverting output terminal and the ground, has a gate connected to the inverting output terminal, and allows a current to flow only in the direction from the inverting output terminal to the ground when the eighth tunnel transistor turns on.

18. The SRAM device according to claim 17, wherein the first and second tunnel transistors have a higher drive power than the fifth to eighth tunnel transistors.

19. The SRAM device according to claim 11, wherein the source regions of the first to fourth tunnel transistors have the same conductivity type, and the drain regions of the first to fourth tunnel transistors have the same conductivity type.

* * * * *